United States Patent [19]

Hayashi et al.

[11] Patent Number: 4,803,095

[45] Date of Patent: Feb. 7, 1989

[54] CHEMICAL VAPOR REACTION PROCESS BY VIRTUE OF UNIFORM IRRADIATION

[75] Inventors: Shigenori Hayashi; Naoki Hirose; Takashi Inujima, all of Atsugi; Kenji Ito, Machida, all of Japan

[73] Assignee: Semiconductor Energy Laboratory Co., Ltd., Kanagawa, Japan

[21] Appl. No.: 154,290

[22] Filed: Feb. 10, 1988

Related U.S. Application Data

[62] Division of Ser. No. 97,188, Sep. 16, 1987, Pat. No. 4,768,464.

[30] Foreign Application Priority Data

Sep. 26, 1986 [JP] Japan ................... 61-148082
Sep. 26, 1986 [JP] Japan ................... 61-229255
Sep. 26, 1986 [JP] Japan ................... 61-229256
Sep. 26, 1986 [JP] Japan ................... 61-229257
Sep. 26, 1986 [JP] Japan ................... 61-229258

[51] Int. Cl.$^4$ ............................................. B05D 3/06
[52] U.S. Cl. ................................. 427/54.1; 427/255.2; 427/255.3
[58] Field of Search .................. 427/54.1, 255.2, 255.3

Primary Examiner—Bernard Pianalto
Attorney, Agent, or Firm—Gerald J. Ferguson, Jr.

[57] ABSTRACT

An improved chemical vapor reaction system is described. The system is characterized by its light source which radiates ultraviolet light to a substrate to be processed. Before the light source, an obturating plate is placed so that the intensity of the light source is apparently reduced at the center position. With this light, the substrate is irradiated with light having uniform intensity over the surface of the substrate to be processed.

2 Claims, 7 Drawing Sheets

CHEMICAL VAPOR REACTION PROCESS BY VIRTUE OF UNIFORM IRRADIATION

This is a divisional application of Ser. No. 097,188 filed 9/16/87 now U.S. Pat. No. 4,768,464.

BACKGROUND OF THE INVENTION

This invention relates to a chemical vapor reaction apparatus and a process with uniform irradiation.

It has been proposed to form a conductor, semiconductor or insulator film on a substrate by photo enhanced CVD. For instance, the formation of a silicon or silicon compound film by p hoto CVD is attracting the interests in the semiconductor field, which is implemented by decomposition of $Si_nH_{2n+2}$ ($n=1, 2, 3, \ldots$) in virtue of the optical energy of ultraviolet light. The thickness of a film deposited by photo CVD depends on the intensity of the incident light. FIG. 1 is a graphical diagram showing the relationship between the intensity of incident light on a substrate to be coated and the thickness of a film thus formed. As shown in this figure, the thickness increases in proportion to the intensity of incident light, and the coefficient is about 0.7.

In prior art, a quasi-uniform irradiation on a substrate has been obtained by arranging a number of lamps on a large area. For example, a uniform film with 300 mm in width and 300 mm in length is formed by use of a number of low pressure mercury lamps each having 400 mm in radiation length arranged in parallel with an interval of 400 mm. However, as long as using a definite number of lamps, nonuniformity to the thickness of a film is inevitable.

For this reason, when a more uniform film or a film having a larger area is desired to be coated, the number of lamps has to increase, and thereofre the size and the cost of a CVD apparatus are also expanded. The problem arises also in the case of photo-etching, photo-ashing and photo-cleaning.

SUMMARY OF THE INVENTION

It is therefore an object of the invention to provide a compact photo enhanced chemical vapor reaction apparatus and chemical vapor processing method capable of forming a uniform film or processing a substrate uniformly over the surface thereof.

It is another object of the invention to provide a cheaper photo enhanced chemical vapor reaction apparatus and method for processing a substrate at a low cost.

DETAILED DESCRIPTION OF THE PREFERRED EMBODIMENTS

Figure 1:
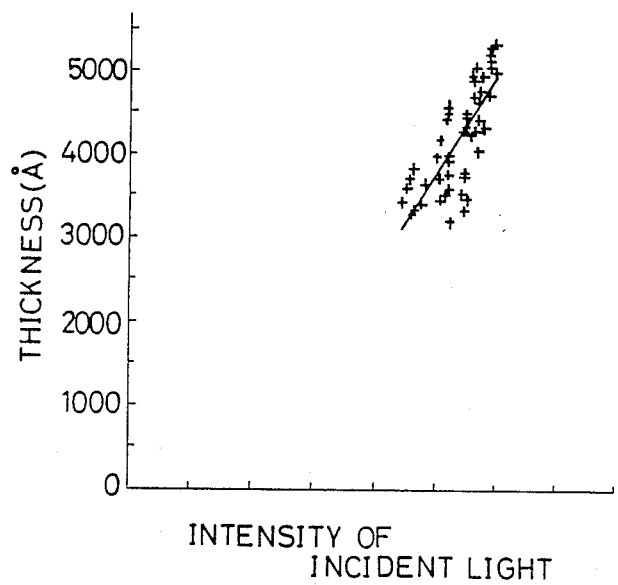
FIG. 1 is a graphical diagram showing the relationship between the intensity of incident light on a substrate to be processed and the thickness of a film formed on the substrate by photo CVD with the incident light, in accordance with prior art.
Figure 2:
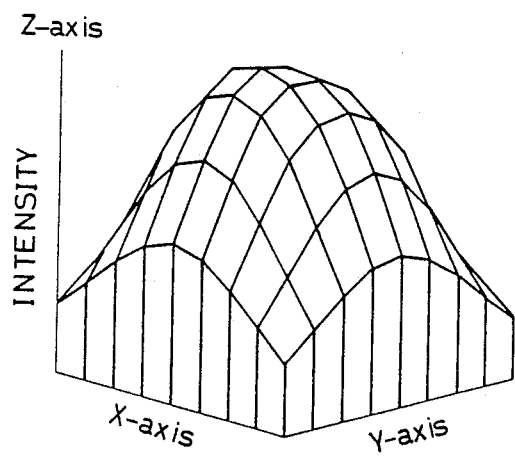
FIG. 2 is a perspective graphical view showing the thickness of a film deposited on a substrate in accordance with prior art.

To facilitate the understanding of the present invention, the prior art shortcomings will be reviewed again with reference to FIG. 2. In the figure, X-axis and Y-axis indicate the positions on the surface to be irradiated, and Z-axis is used to indicate the intensity of the incident light. The graphical view is plotted on the basis of computing results of the intensity of light with 185 namo meters on a plane of 160 mm×160 mm distant from a plurality of lamps arranged on a radiation plane of 150 mm×150 mm in prior art configuration. As shown in the figure, the light is incident on a center portion with a stronger light than that on a peripheral position. The area where the intensity fluctuation is less than ±10% is less than 18% of the whole area of 160 mm×160 mm.

Figure 3:
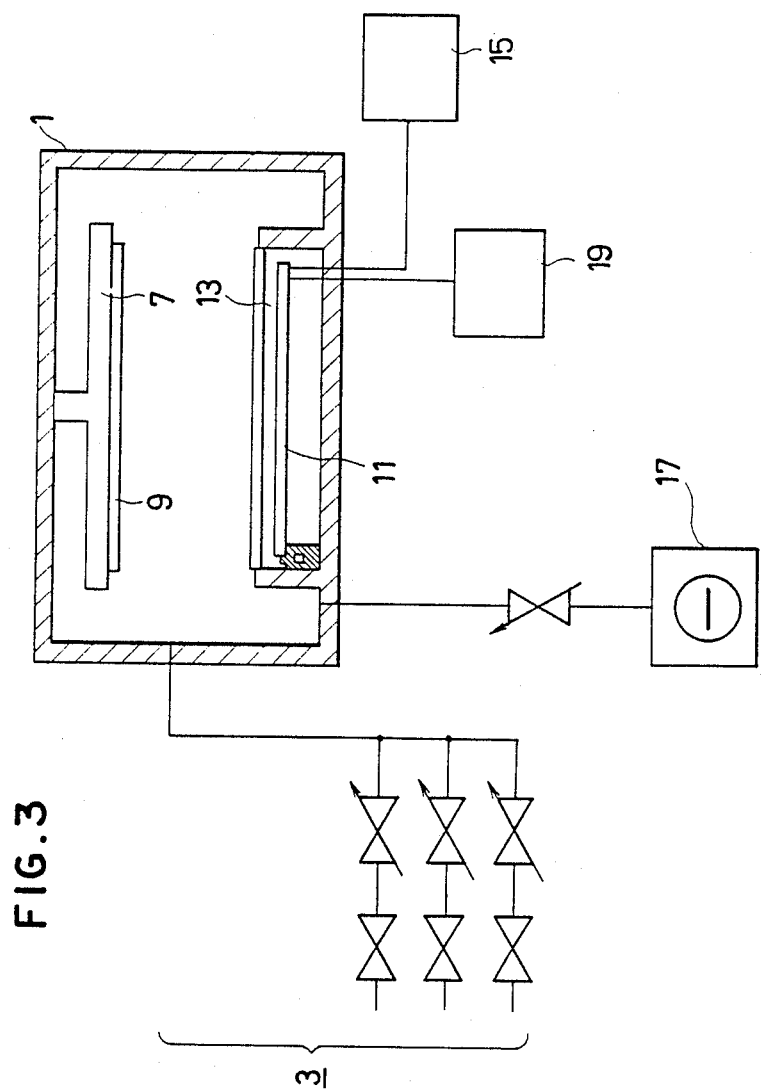
FIG. 3 is a block diagram showing a photo enhanced CVD apparatus in accordance with the present invention.

Referring to FIG. 3, a photo enhanced CVD apparatus in accordance with the invention is illustrated. In the figure, the apparatus comprises a reaction chamber 1, a process gas introducing system 3, an exhausting system 5, a holder 7 for holding a substrate 9, a mercury lamp 11 provided in a light source chamber 13 and a power supplying system 15 for the lamp 11. Reactive gas introduced into the reaction chamber initiates an optical reaction by virtue of the optical energy in the form of ultraviolet light from the lamp 11 and a product is deposited on the substrate 9.

Figure 4:
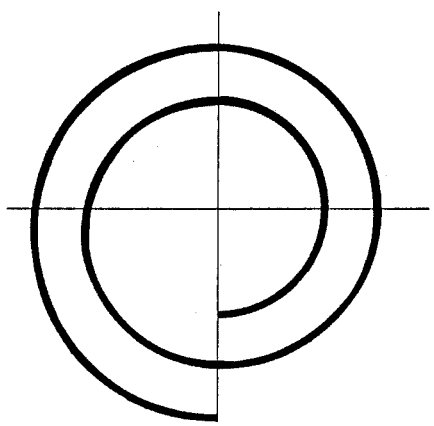
FIG. 4 is a plan view showing the profile of a bulb in accordance with the present invention.
Figure 5:
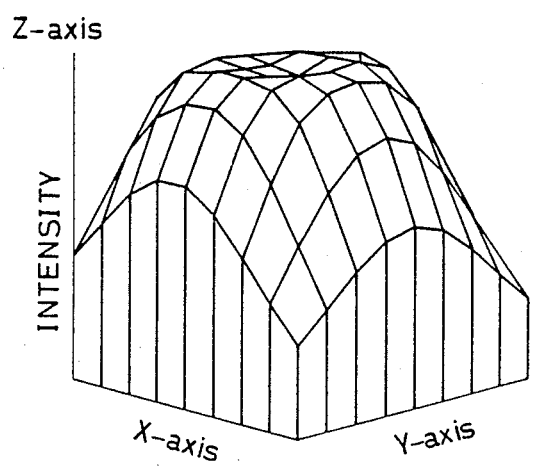
FIG. 5 is a perspective graphical view showing the thickness of a film deposited by use of the bulb as illustrated in FIG. 4 in accordance with the present invention.

The lamp 11 is comprised of a bulb with 18mm in diameter and 690 mm in radiating length in which is sealed mercury gas, like a prior art, and a stabilizer (200W) provided for the lamp. The bulb, however, is formed into a spiral as illustrated in FIG. 4. With this bulb, the center position is not the largest intensity position because the spiral does not reach to the center position. FIG. 5 is a perspective graphical diagram showing the intensity of incident light having 185 nm in wavelength versus the position with respect to the bulb, calculated by the procedure as used to obtain FIG. 2. As shown in FIG. 5, the intensity becomes uniform by the recess of the center portion, and the area where the intensity fluctuation is limited less than ±10% become 55% of the whole area. According to experimental, the computed results are coincident to FIG. 5 with 5% differences.

Figure 6:
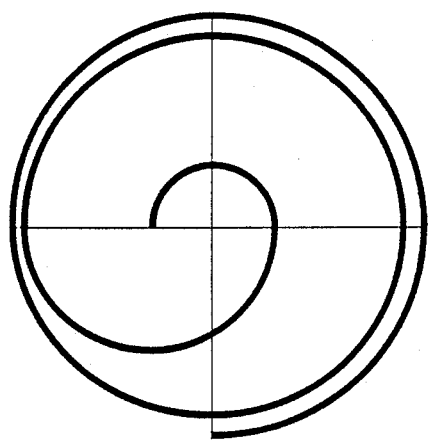
FIG. 6 is a plan view showing the profile of a bulb in accordance with the present invention.
Figure 7:
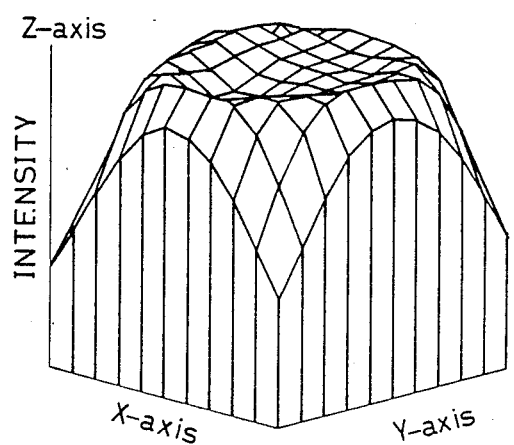
FIG. 7 is a perspective graphical view showing the thickness of a film deposited by use of the bulb as illustrated in FIG. 6 in accordance with the present invention.

As the curve of a bulb, a spiral illustrated in FIG. 6 whose inner end is extending toward the center position thereof can be employed. The bulb designed in accordance is filled with mercury gas together with a buffer gas consisting of Ar gas and Kr gs. The maximum diameter of this spiral is 150 mm. The bulb diameter is 4 mm. The radiating length is 900 mm. A computer simulation demonstration of the intensity distribution is shown in FIG. 7, as in similar manner to FIG. 5. With such a bulb designed as shown in FIG. 6, $SiO_2$ films were deposited in the apparatus illustrated in FIG. 3. The fluctuation of the $SiO_2$ film thickness was limited less than ±10 inside a 130 mm-diameter circle. This has been improved as compared with a corresponding 65 mm-diameter circle of prior art.

On the surfaces of four 6-inch wafers, silicon nitride films were deposited in virtue of light emitted from four lamps by the process as described in the preceding paragraph. In this case, a mercury lamp designed as illustrated in FIG. 6 was provided for each wafer. The thickness fluctuation of the film over each wafer was limited less than ±10. The fluctuation of the average thickness of the four deposited film was less than 5%.

Figure 9:
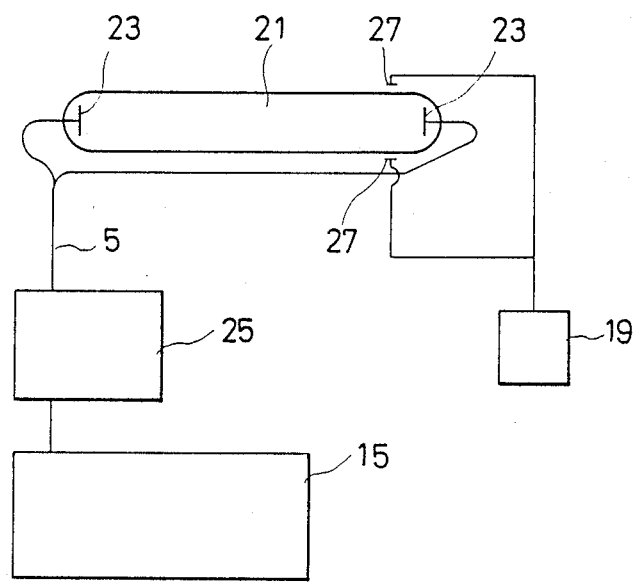
FIG. 9 is an explanatory view showing the process of initiating discharge in a lamp.

The CVD apparatus further comprises a high voltage generator 19 which supplies a high voltage between electrodes placed adjacent to one of the electrodes for the lamp 11. For clarification of explanation, this configuration is described schematically in conjunction with FIG. 9 in which a straight bulb 21 is illustrated in place of the spiral bulb. A bulb 21 is filled with mercury gas exclusively. Between two electrodes 23 and 23 provided at the opposite ends of the bulb, a high frequency voltage (13.56 MHz) is applied through a matching circuit 25. In this condition, discharge does not take place yet. A very high voltage is applied from the high voltage generator 19 to a pair of electrodes 27 and 27 near one of the electrodes 23 and 23 in order to initiate discharge in the bulb. The very high voltage is prepared by elevating a commercial voltage supply at 50 Hz through a transformer to 5 kV. The discharge initiated by the very high voltage is kept even after the very high voltage disappears.

Figure 8A:
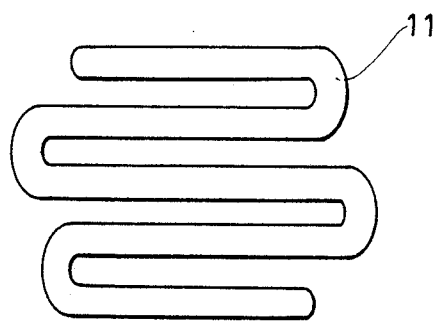
FIGS. 8(A) and 8(B) are plan views showing a light source used in a photo enhanced CVD apparatus in accordance with the present invention.
Figure 8B:
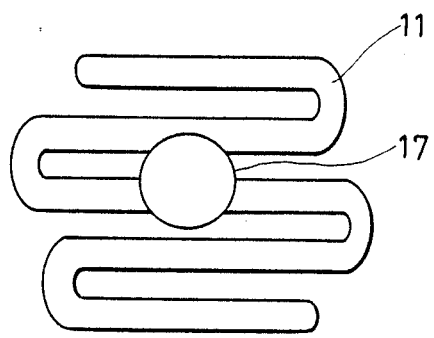

FIGS. 8(A) and 8(B) are explanatory plan views showing another embodiment of the invention. In this embodiment, a lamp illustrated in FIG. 8(A) is used. Only with this lamp, uniform intensity of the irradiation can not be obtained of course. So, as shown in FIG. 8(B), an obturating metalic plate 17 is placed before the lamp to reduced the intensity at the center position. The obturating plate 17 is shaped in a similar form to the profile of a surface to be coated. Of course, the size of the obturating plate 17 may be different from the coated surface. In this case, the obturating plate is designed into the form of a 30 cm-diameter circular, corresponding to a 4-inch-diameter wafer of silicon semiconductor as a substrate to be processed. When a rectangular substrate is desired to be coated, the obturating member should be rectangular. The most long straight portion of the lamp has 120 mm in length, and the diameter of the bulb is 10 mm. In this condition, the intensities were measured at several points 50 mm distant from the lamp and, as a result, the fluctuation of the intensity was limited less than ±5.2% in a circle having the diameter of 125 mm. Namely, this experimental result supports the computing result shown in FIG. 5.

Next, by means of a photo enhanced CVD apparatus equipped with the lamp illustrated in FIG. 8(B), a silicon nitride film was formed on the 4-inch semiconductor wafer. A reactive gas was inputted at 400Pa into the reaction chamber, and the wafer was irradiated with ultraviolet light to initiate an optical reaction. The substrate temperature was 300°C. The process gas consists of $Si_2H_6$ inputted at 10 SCCM and $NH_3$ inputted at 200 SCCM. The film thickness of the silicon nitride film fluctuated only ±6.7% on the 4-inch wafer.

As contrast experimental, the similar deposition was made on the 4-inch wafer by means of the same apparatus without the obturating plate 17. The silicon nitride film thus deposited had a great thickness at the conter position which was double the thickness at a peripheral position. When the diameter of the obturating plate was lessened to less than 20 mm, few effect of the obturating plate was observed. By contrast, when the diameter increased to larger than 60 mm, the intensity became too weak at a center position so that uniform irradiation could not be obtained. In general, the diameter of an obturating plate should be chosen between ½ and ¼, more preferably, ⅓ and 2/5 of the maximum dimension of the light source (in terms of area, between ¼ and 1/16, more preferably, 1/9 and 4/25). Although this embodiment utilizes one lamp which is equivalent to five lamps arranged in parallel, a plurality of straight lamps can be used before which is placed an obturating plate.

According to the invention, uniform iradiation was obtained not by making a light source uniform or large but by reducing the intensity of a center position of the light source. It may be easily understood that the same action operated in the above embodiment can be expected also in other processes using light irradiation, such as photo-etching and photo-etching.

The invention should not limited to the above particular embodiments and many modifications and variations may cause to those skilled in the art. For example, in place of a spiral, a quasi-polygon can be used as a profile of the bulb whose one end is directed to the center so that the center portion becomes a radiating portion whose intensity is less than that at a peripheral portion.

We claim:

1. A chemical vapor reaction process comprising:
   disposing a substrate in a reaction chamber;
   inputting a reactive gas to said reaction chamber; and
   irradiating said substrate with light from a light source,
   said process characterized in that the intensity of the light incident on said substrate at the center position thereof is lower than that at the peripheral position.

2. The process of claim 1 wherein the light from said light source is radiated through an obturating plate positioned before the center position of said light source.

* * * * *